United States Patent [19]
Hofmann et al.

[11] Patent Number: 6,153,475
[45] Date of Patent: Nov. 28, 2000

[54] METHOD FOR THE MANUFACTURING A MEMORY CELL CONFIGURATION

[75] Inventors: Franz Hofmann, München; Josef Willer, Riemerling; Hans Reisinger, Grünwald; Wolfgang Krautschneider, Hohenthann; Paul-Werner von Basse, Wolfratshausen, all of Germany

[73] Assignee: Siemens Aktiengesellschaft, Munich, Germany

[21] Appl. No.: 09/331,495

[22] PCT Filed: Nov. 4, 1997

[86] PCT No.: PCT/DE97/02549

§ 371 Date: Jun. 21, 1999

§ 102(e) Date: Jun. 21, 1999

[87] PCT Pub. No.: WO98/27586

PCT Pub. Date: Jun. 25, 1998

[30] Foreign Application Priority Data

Dec. 19, 1996 [DE] Germany .................. 196 53 107

[51] Int. Cl.[7] .................................................. H01L 21/336
[52] U.S. Cl. .............................................. 438/270; 438/589
[58] Field of Search .................................. 438/137, 138, 438/212, 268, 269, 270, 589

[56] References Cited

U.S. PATENT DOCUMENTS

| | | | |
|---|---|---|---|
| 4,954,854 | 9/1990 | Dhong et al. | 257/332 |
| 5,330,927 | 7/1994 | Lee | 438/270 |
| 5,405,794 | 4/1995 | Kim | 438/270 |
| 5,443,992 | 8/1995 | Risch et al. | 438/270 |

FOREIGN PATENT DOCUMENTS

| | | |
|---|---|---|
| 0 599 318 A2 | 6/1994 | European Pat. Off. . |
| 42 14 923 A1 | 12/1992 | Germany . |
| 44 34 725 C1 | 5/1996 | Germany . |
| 195 14 834 C1 | 1/1997 | Germany . |
| 7 142610 | 6/1995 | Japan . |

*Primary Examiner*—Chandra Chaudhari
*Attorney, Agent, or Firm*—Schiff Hardin & Waite

[57] ABSTRACT

For the manufacture of a memory cell arrangement with first memory cells that comprise a vertical MOS transistor and with second memory cells that do not comprise an MOS transistor, whereby the memory cells are arranged along opposite edges of strip-type trenches, memory cells that are adjacent along the trenches (5) are manufactured successively. The spacing of adjacent memory cells is determined in particular by means of a spacer technology. By this means, a space requirement per memory cell of $1F^2$ can be realized, whereby F is the minimum structural size of the respective technology.

7 Claims, 11 Drawing Sheets

FIG 19 ature filed with a trench filling made of a first insulating material, the

METHOD FOR THE MANUFACTURING A MEMORY CELL CONFIGURATION

BACKGROUND OF THE INVENTION

For many electronic systems, memories are required into which the data are fixedly written in digital form. Memories of this sort are known as, among other designations, fixed-value memories, read memories, or read-only memories.

For large quantities of data, such as in particular the digital storage of music, plastic discs called compact discs, which are coated with aluminum, are often used as read memories. These discs comprise in their coating two kinds of punctiform recesses, allocated to the logical values zero and one. The information is stored digitally in the arrangement of these recesses.

In order to read the data stored on a compact disc, the disc is mechanically rotated in a read apparatus. The punctiform recesses are scanned using a laser diode and a photocell. Typical scan rates are thereby 2×40 kHz. Approximately 5 Gbits of information can be stored on a plastic disc.

The read apparatus comprises moving parts that are subject to mechanical wear, require a comparatively large volume, permit only a relatively slow data access, and have a large current consumption. In addition, the read apparatus is sensitive to vibrations, and thus has only limited suitability for mobile systems.

For the storage of smaller amounts of data, fixed-value memories based on semiconductors, in particular on silicon, are often used. During the reading out of the memory cell arrangement, the individual memory cells are selected via a wordline. The gate electrode of the MOS transistors is respectively connected with a wordline. The input of each MOS transistor is connected with a reference line and the output is connected with a bitline. During the read process, it is evaluated whether or not a current is flowing through the transistor. The logical values zero and one are allocated accordingly.

Technologically, the storage of a zero and a one in these fixed-value memories is effected in that, in memory cells in which the logical value allocated to the state "no flow of current through the transistor" is stored, no MOS transistor is manufactured, or no conductive connection to the bitline is realized. Alternatively, the two logical values can be realized by MOS transistors that have different threshold voltages due to different implantations in the channel region.

These known silicon memories mostly have a planar construction. A minimum space requirement per memory cell is thereby required that is about 4 to 6 $F^2$, whereby F is the smallest structural size that can be manufactured in the respective technology. Given a 0.4 $\mu$m technology, planar fixed-value silicon memories are thus limited to storage densities of around 1 bit/$\mu m^2$.

From U.S. Pat. No. 4,954,854, it is known to use vertical MOS transistors in a fixed-value memory. For this purpose, the surface of the silicon substrate is provided with hole-type trenches, adjoined at the floor by a source region, and adjoined at the substrate surface by a drain region that surrounds the trench, and along whose edges a channel region is arranged. The surface of the trench is provided with a gate dielectric, and the trench is filled with a gate electrode. In this arrangement, zero and one are distinguished in that for one of the logical values no trench is etched and no transistor is manufactured. Adjacent memory cells are insulated from one another by insulating structures arranged laterally thereto.

In the prior German patent application P 19 514 834.7, a fixed-value memory cell arrangement was proposed that has first memory cells that comprise a vertical MOS transistor, and that has second memory cells that comprise no vertical MOS transistor. The memory cells are thereby arranged along opposite edges of strip-type insulation trenches that run in parallel. The memory cell arrangement can be realized with a space requirement of $2F^2$ per memory cell, whereby F is the minimum structural size of the respective technology.

SUMMARY OF THE INVENTION

The present invention is based on the problem of indicating a method for manufacturing a semiconductor-based memory cell arrangement in which an increased storage density is achieved with few manufacturing steps and high efficiency.

This problem is solved according to the invention by means of a method for manufacturing a memory cell arrangement, in which a cell field with memory cells arranged in rows and columns is fashioned on a main surface of a semiconductor substrate, whereby first memory cells in which a first logical value is stored comprise an MOS transistor that is vertical to the main surface, and second memory cells in which a second logical value is stored do not comprise an MOS transistor, wherein the semiconductor substrate is doped with a first conductivity type at least in the region of the cell field, strip-type trenches are produced that run essentially in parallel in the direction of the columns, strip-type doped regions are respectively fashioned on the floor of the trenches and on the main surface between adjacent trenches, which regions are doped with a second conductivity type opposed to the first, the trenches are filled with a trench filling made of a first insulating material, the memory cells are respectively fashioned at opposite edges of the trenches, for the fashioning of vertical MOS transistors, holes are opened that respectively adjoin an edge of one of the trenches, and that extend up to the doped region that runs on the floor of the trench, and whose surfaces are provided with a gate dielectric and with a gate electrode connected with a wordline, at first the memory cells are fashioned that are arranged along first rows, which are arranged in alternating fashion with second rows and form therewith the rows of the cell field, for the fashioning of first gate electrodes of the vertical MOS transistors arranged in the first rows and of the first wordlines that run parallel to the first rows, a first electrode layer is produced and structured, insulation structures are fashioned that cover the surface of the first wordlines and of the first electrodes, subsequently the memory cells are fashioned that are arranged along the second rows, and for the fashioning of second gate electrodes of the MOS transistors arranged in the second rows and second wordlines arranged between adjacent first wordlines, a second electrode layer is produced and structured. Further constructions of the invention provide that the fashioning of the insulating structures an insulating layer is applied on the first electrode layer that is structured in common with the first electrode layer, and insulating spacers are fashioned on the edges of the first wordlines.

In an embodiment of the invention, in the fashioning of the vertical MOS transistors that are arranged along the first rows, the holes are fashioned with a greater width than the first wordlines and first gate electrodes that are later to be structured, so that after the fashioning of the first wordlines and of the first gate electrodes gaps arise in the region of the vertical MOS transistors lateral to the first gate electrodes, the gaps are filled with the first insulating material before the fashioning of the holes for the vertical MOS transistors that are arranged along the second rows, the insulating structures are made of a second insulating material to which the trench fillings and the second electrode layer can be etched selectively, and the second electrode layer is structured by etching back selectively to the insulating structures.

Preferably, masking spacers are fashioned on the side walls of the trenches before the fashioning of the strip-type doped regions, which spacers are removed before the filling of the trenches. In a preferred embodiment, the spacing between adjacent trenches is essentially equal to the width of the trenches, and the hole for the fashioning of the vertical MOS transistors respectively extends up to half the width of the, trench. Specifically, the trench fillings comprise silicon oxide, the insulating structures comprise silicon nitride, and the semiconductor substrate comprises monocrystalline silicon at least in the region of the cell field.

According to the invention, the trenches are dimensioned in the direction of the columns in such a way that they extend beyond the cell field, and simultaneously with the fashioning of the vertical MOS transistors that are arranged along the first rows, outside the cell field vertical MOS transistors are fashioned for a drive circuit for the strip-type doped regions.

In the method, a cell field with memory cells arranged in rows and columns is fashioned on a main surface of the semiconductor substrate. First memory cells in which a first logical value is stored thereby comprise an MOS transistor that is vertical to the main surface. In contrast, second memory cells in which a second logical value is stored do not comprise an MOS transistor. In this memory cell arrangement, the digital information is stored by means of the arrangement of the first and second memory cells.

The semiconductor substrate preferably comprises monocrystalline silicon, at least in the region of the cell field. Preferably, a monocrystalline silicon disc or an SOI substrate is used as a semiconductor substrate. The semiconductor substrate is doped with a first conductivity type at least in the region of the cell field. The doping can take place by means of diffusion, implantation or in situ doped epitaxy.

Strip-type trenches are produced in the main surface of the semiconductor substrate, essentially in parallel in the direction of the columns. On the floor of the trenches and on the main surface between adjacent trenches, strip-type doped regions are fashioned that are doped with a second conductivity type opposed to the first. In the manufactured memory cell arrangement, the strip-type doped regions act as bitlines and/or reference lines, according to their connection.

The strip-type doped regions are preferably fashioned simultaneously on the main surface and on the floor of the trenches by means of an implantation. Alternatively, for the manufacture of the strip-type doped regions a region doped with a second conductivity type can be fashioned over the whole surface, e.g. by implantation or diffusion, before the fashioning of the trenches. The strip-type doped regions arranged on the main surface then arise by means of structuring, during the fashioning of the trenches, of the region doped with the second conductivity type. The strip-type doped regions arranged on the floor of the trenches are subsequently fashioned by implantation. The surface of the strip-type doped regions arranged on the main surface is thereby protected by a trench mask used for the trench fashioning. This alternative does indeed required more process steps, but has the advantage that the surface of the strip-type doped regions arranged on the main surface can be provided with a protective layer that is co-structured during the trench fashioning.

The trenches are filled with a trench filling of a first insulating material, preferably silicon oxide. With respect to a bubble-free filling of the trenches, it is advantageous to deposit the first insulating material with a conformal edge covering, e.g. in a first TEOS tetraethylorthosilicate method, and to etch it back or polish it until the main surface is exposed.

The memory cells are subsequently fashioned at opposite edges of the trenches. For the fashioning of the vertical MOS transistors, which are provided as first memory cells, holes are thereby opened that respectively adjoin an edge of one of the trenches and that extend up to the doped region that runs on the floor of the trench. The edge of the trenches exposed in the region of the holes is provided with a gate dielectric and with a gate electrode that is connected with a wordline. The wordlines are fashioned in such a way that they run parallel to the rows.

According to the invention, adjacent memory cells are fashioned, in separate process steps, along a column, i.e. a trench. First the memory cells, which are arranged along first rows, are fashioned. The first rows are arranged in alternating fashion with second rows, and form together with the second rows the rows of the cell field.

For the fashioning of first gate electrodes of the vertical MOS transistors arranged in the first rows, and of first wordlines that run, parallel to the first rows, above the first gate electrodes of the vertical MOS transistors arranged in the first rows, a first electrode layer is produced and structured. The first electrode layer thereby completely fills the holes that have been opened for the vertical MOS transistors of the first rows. The part of the first electrode layer arranged in the holes forms the first gate electrodes after the structuring. According to their manufacture, they are connected with the strip-type first wordlines that run parallel to the first rows.

Subsequently, insulating structures are fashioned that cover the surface of the first wordlines.

Subsequently, the memory cells are fashioned that are arranged along the second rows, respectively between adjacent first rows. For the fashioning of second gate electrodes of the vertical MOS transistors arranged in the second rows, and of second wordlines that are arranged between adjacent first wordlines, a second electrode layer is produced and structured.

Since the first wordlines are insulated from the second wordlines by the insulating structures, and since the insulating structures are fashioned before the production of the second wordlines, the structuring of the second wordlines is not critical. The spacing between the first wordlines and the adjacent second wordlines can thus be smaller than the width of the first wordlines and of the second wordlines. A space requirement per memory cell of less than $2F^2$ can thus be realized in the method.

Preferably, for the fashioning of the insulating structures on the first electrode layer an insulating layer is applied that is structured jointly with the first electrode layer. Insulating spacers are fashioned at the edges of the first wordlines.

Preferably, for the fashioning of the vertical MOS transistors that are arranged along the first rows, the holes are fashioned with a width greater than a width corresponding to the width of the first wordlines that are later to be manufactured. In this way, gaps arise after the fashioning of the first wordlines and of the first gate electrodes in the region of the vertical MOS transistors, lateral to the first gate electrodes. Before the fashioning of the holes for the vertical MOS transistors that are arranged along the second rows, these gaps are filled with the insulating material from which the trench fillings are also fashioned. Subsequently, the insulating spacers are fashioned at the edges of the first wordlines.

The insulating structures, which are composed from the insulating spacers and the insulating layer on the surface of the first wordlines, are preferably fashioned from a material to which the trench fillings and the second electrode layer can be etched selectively. They are for example fashioned from silicon nitride. In this case, the structuring of the second electrode layer takes place by means of etching back selectively to the insulating structures. No mask is required for this, since a part of the second electrode layer, which part forms the second wordlines, is arranged in the intermediate spaces between adjacent first wordlines.

For the manufacture of the memory cells, in this case there are required a mask with strip-type openings for the fashioning of the trenches, an additional mask with strip-type openings for the fashioning of the first wordlines, as well as a first programming mask for the fashioning of the holes for the vertical MOS transistors, which are arranged along the first rows, and a second programming mask for the fashioning of the holes for the vertical MOS transistors that are arranged along the second rows. Since the first wordlines run transverse to the trenches, the alignment of the masks with the strip-type openings is not critical. The first programming mask and the second programming mask have openings that are wider than the finished first wordlines and second wordlines. During the opening of the holes, etching selectivities are exploited to compensate imprecise alignments of the programming masks.

BRIEF DESCRIPTION OF THE DRAWINGS

In the following, the invention is explained in more detail on the basis of an embodiment shown in the Figures.

The representations in the Figures are not to scale.

DETAILED DESCRIPTION OF THE PREFERRED EMBODIMENTS

In a semiconductor substrate 1, made for example of p-doped monocrystalline silicon with a doping material concentration of $5 \times 10^{15}$ $cm^{-3}$, for the definition of a cell field first an insulating structure surrounding the cell field, for example a LOCOS local oxidation of silicon insulation or a shallow trench insulation, is fashioned (not shown).

Figure 1:
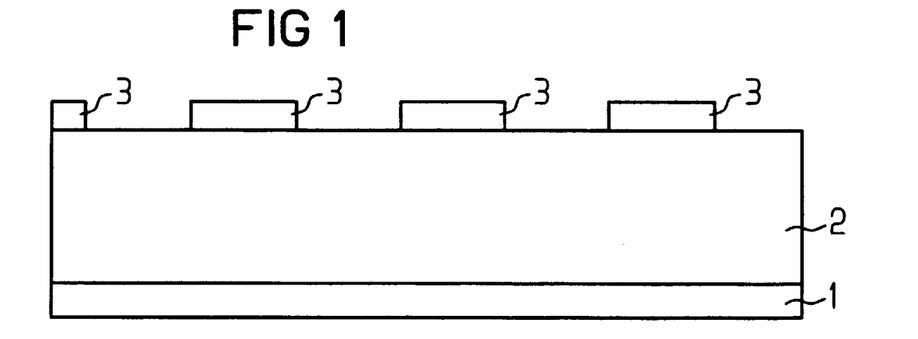
FIG. 1 is a side cross section which shows a semiconductor substrate after the fashioning of a p-doped well and a trench mask.

Subsequently, a p-doped well 2 with a doping material concentration of $2 \times 10^{17}$ $cm^{-3}$ is produced by means of implantation and subsequent tempering in the cell field (see FIG. 1). The p-doped well is fashioned with a depth of e.g. 1 $\mu$m. By means of the deposition of an $SiO_2$ layer, e.g. in a TEOS method, in a thickness of for example 300 nm, and photolithographic structuring of the $SiO_2$ layer by means of anisotropic etching with $CHF_3$, $O_2$, a trench mask 3 is fashioned. The trench mask 3 comprises strip-type openings that have a width of a minimum manufacturable structural size F, for example 0.4 $\mu$m. The spacing between adjacent strip-type openings likewise has a minimum structural size F, for example 0.4 $\mu$m. The length of the strip-type openings is for example 250 $\mu$m.

Figure 2:
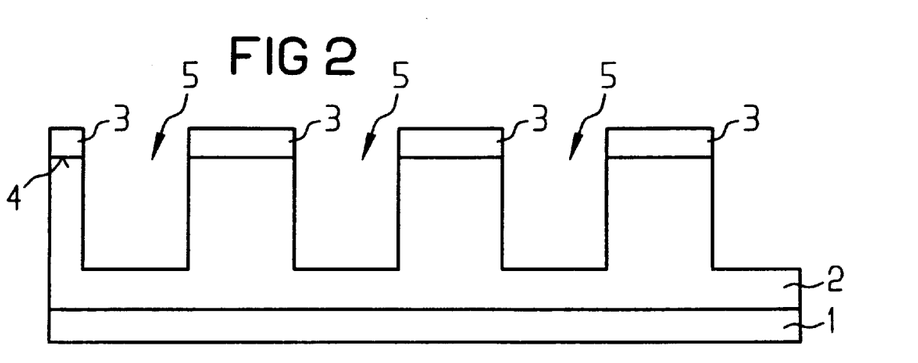
FIG. 2 shows a section through the semiconductor substrate after the fashioning of strip-type trenches.

Using the trench mask 3 as an etching mask, strip-type trenches 5 are etched in a main surface 4 of the semiconductor substrate 1 (see FIG. 2). The etching takes place anisotropically, for example with HBr, He, $O_2$, $NF_3$. The depth of the trenches 5 is for example 0.5 $\mu$m.

Figure 3:
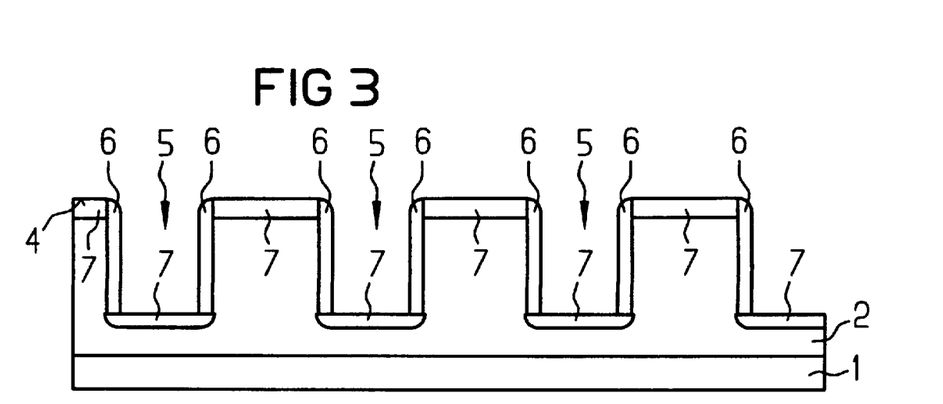
FIG. 3 shows the section after the fashioning of spacers at the trench walls, and fashioning of strip-type doped regions at the trench floors, as well as between adjacent trenches.

After removal of the trench mask 3, masking spacers 6 are fashioned at the edges side walls of the trenches 5 by means of conformal deposition and anisotropic etching back of an $SiO_2$ layer (see FIG. 3). Subsequently, strip-type doped regions 7 are fashioned on the floor of the trenches 5 and between adjacent trenches 5 on the main surface, by means of an implantation, for example with arsenic, with an energy of 50 keV and a dosage of $5 \times 10^{15}$ $cm^{-2}$ (see FIG. 3). The implantation takes place only in the cell field, i.e., outside the cell field the semiconductor substrate 1 is covered with a photoresist mask whose alignment is not critical. The strip-type doped regions comprise a doping material concentration in the region of $1 \times 10^{21}$ $cm^3$ and a depth in the region of 0.2 $\mu$m. During the implantation, the side walls of the trenches 5 are covered by the masking spacers 6.

Figure 4:
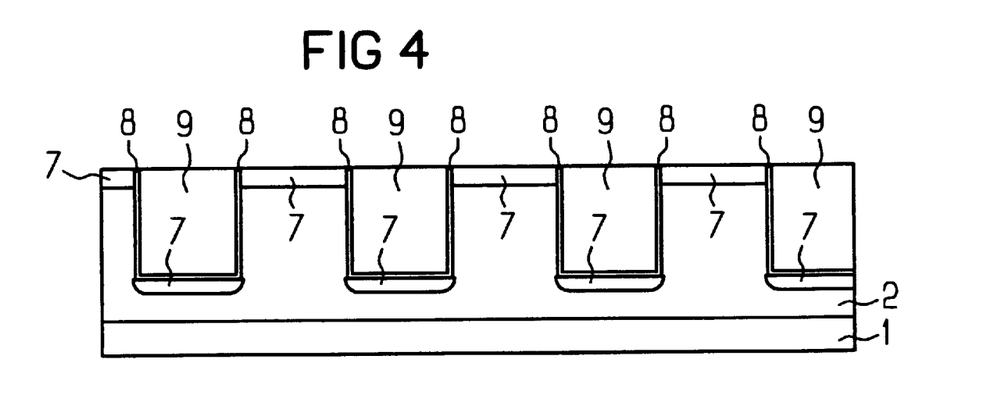
FIG. 4 shows the section through the semiconductor substrate after the filling of the trenches with trench fillings, and subsequent etching back.

After removal of the masking spacers 6 by means of wet-chemical etching, e.g. with HF, HF vapor, a thin oxide layer 8 is fashioned on the surface of the trenches 5 by means of thermal oxidation. By this means, the crystal surface is improved. Subsequently, by means of conformal deposition, for example in a TEOS method, of silicon oxide, and anisotropic etching back, the trenches are provided with a trench filling 9 (see FIG. 4). The etching back takes place for example with $CHF_3$, $O_2$, selectively to silicon.

Figure 5:
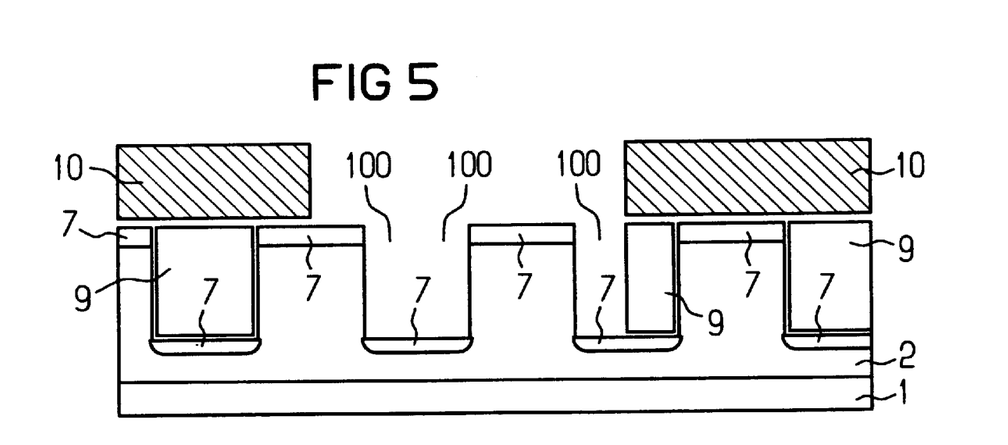
FIG. 5 shows the section through the semiconductor substrate after the fashioning of a first programming mask and the etching of first holes.

Subsequently, a first programming mask 10 of photoresist is produced with the aid of photolithographic process steps (see FIG. 5). The first programming mask 10 has openings at locations at which vertical MOS transistors are to be fashioned. For each of the MOS transistors, the corresponding opening has a rectangular cross-section parallel to the main surface 4, which has parallel to the trenches 5 a length of two minimum structural widths F, i.e. for example 0.8 µm, and transverse to the trenches 5 a width of one minimum structural width F, i.e. for example 0.4 µm. Adjacent openings thereby coincide. The openings for a vertical MOS transistor thereby respectively overlap an edge of the trench 9.

By means of anisotropic etching selectively to silicon, for example with HBr, $Cl_2$, He, the trench fillings 9 that are exposed inside the openings of the first programming mask 10 are removed for the fashioning of first holes 100. The surface of the strip-type doped region 7 arranged on the floor of the trench is thereby exposed in the respective openings (see FIG. 5).

After removal of the photoresist of the first programming mask 10, a gate dielectric 11 is fashioned at least on the side walls of the trenches 5. The gate dielectric 11 is for example fashioned by thermal oxidation at 820° C. in a thickness of for example 10 nm (see FIG. 6). The gate dielectric 11 arises during thermal oxidation at all exposed silicon surfaces, in particular at exposed surfaces of the strip-type doped regions 7.

Figure 6:
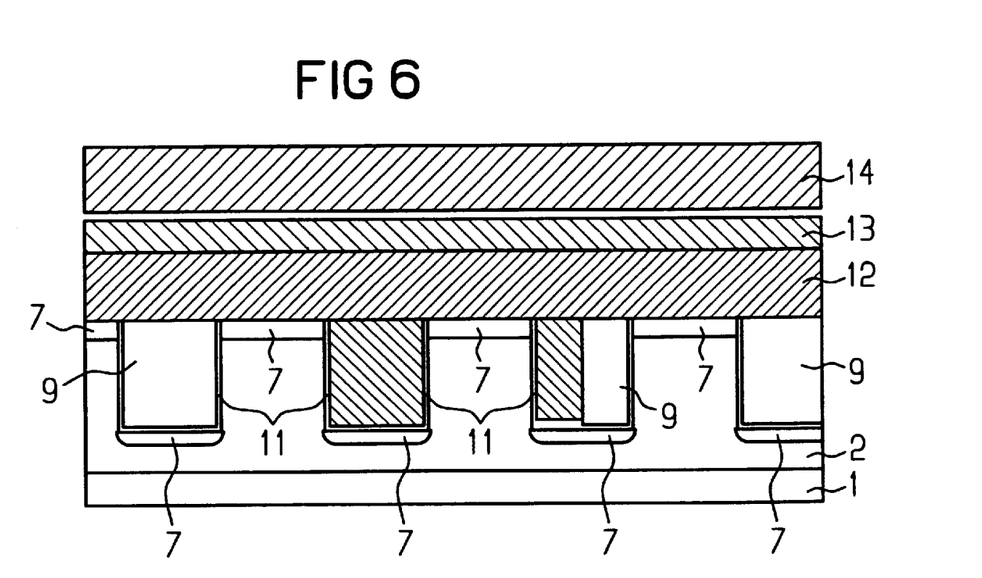
FIG. 6 shows the section through the semiconductor substrate after the fashioning of a first electrode layer, of an insulating layer, and of a wordline mask.

Subsequently, a first electrode layer 12, made for example of doped polysilicon, is fashioned over the whole surface (see FIG. 6). Alternatively, the first electrode layer 12 can be fashioned from metal silicide or metal. The first electrode layer 12 is for example fashioned by means of in situ doped deposition of polysilicon in a layer thickness of for example 400 nm. The first electrode layer 12 completely fills the first holes 100 for the vertical MOS transistors, which holes were fashioned with the aid of the first programming mask 10.

An insulating layer 13 of silicon nitride is subsequently applied on the first electrode layer 12 in a thickness of 100 nm. On the insulating layer 13, a wordline mask 14 of photoresist is fashioned with the aid of photolithographic process steps. The wordline mask 14 comprises strip-type openings that run transverse to the trenches 5. The strip-type openings comprise in the direction of the trenches 5 a width of for example a minimum structural size F, i.e. for example 0.4 µm. The spacing between adjacent strip-type openings is likewise of a minimum structural size F, for example 0.4 µm.

By means of anisotropic etching with $N_2$, $O_2$, He, $SF_6$, the insulating layer 13 and the first electrode layer 12 are etched selectively to silicon oxide with HBr, $Cl_2$, He, using the wordline mask 14 as an etching mask. The first electrode layer in the region of the vertical MOS transistors is thereby removed up to the floor of the trenches. Subsequently, the wordline mask 14 is removed.

Figure 7:
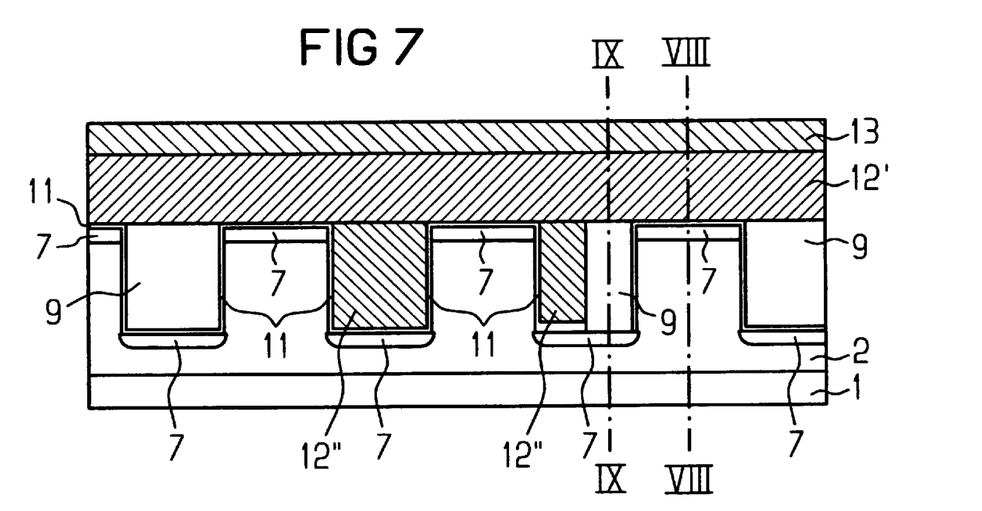
FIG. 7 shows the section through the semiconductor substrate after fashioning of first wordlines and first gate electrodes, and removal of the wordline mask.
Figure 8:
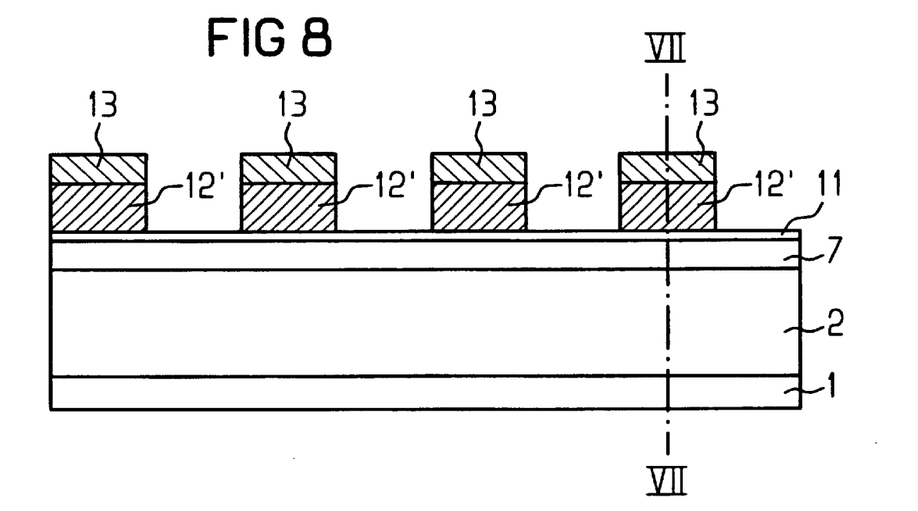
FIG. 8 shows the section designated VIII—VIII in FIG. 7.
Figure 9:
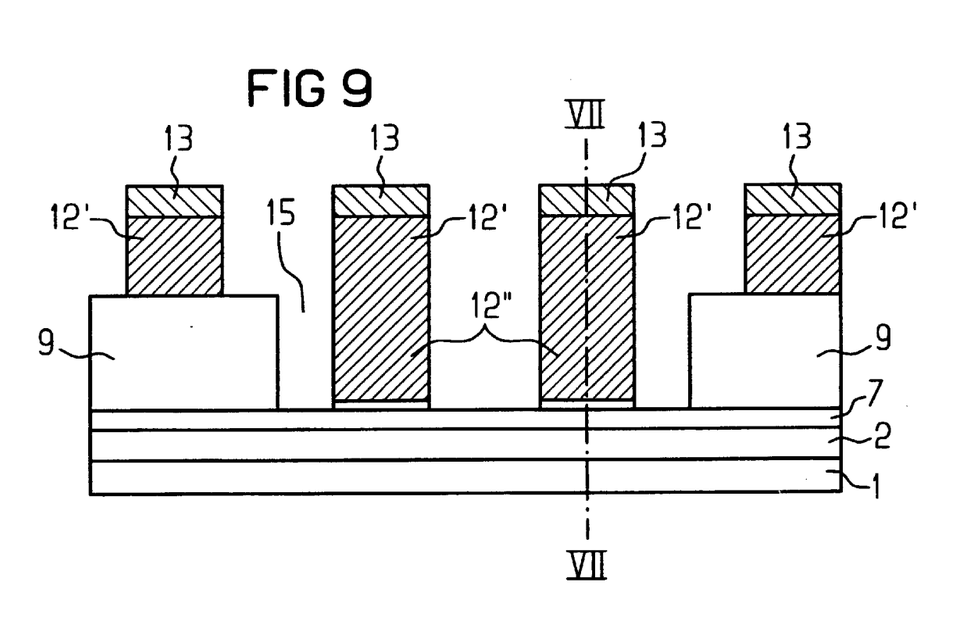
FIG. 9 shows the section designated IX—IX in FIG. 7.
Figure 10:
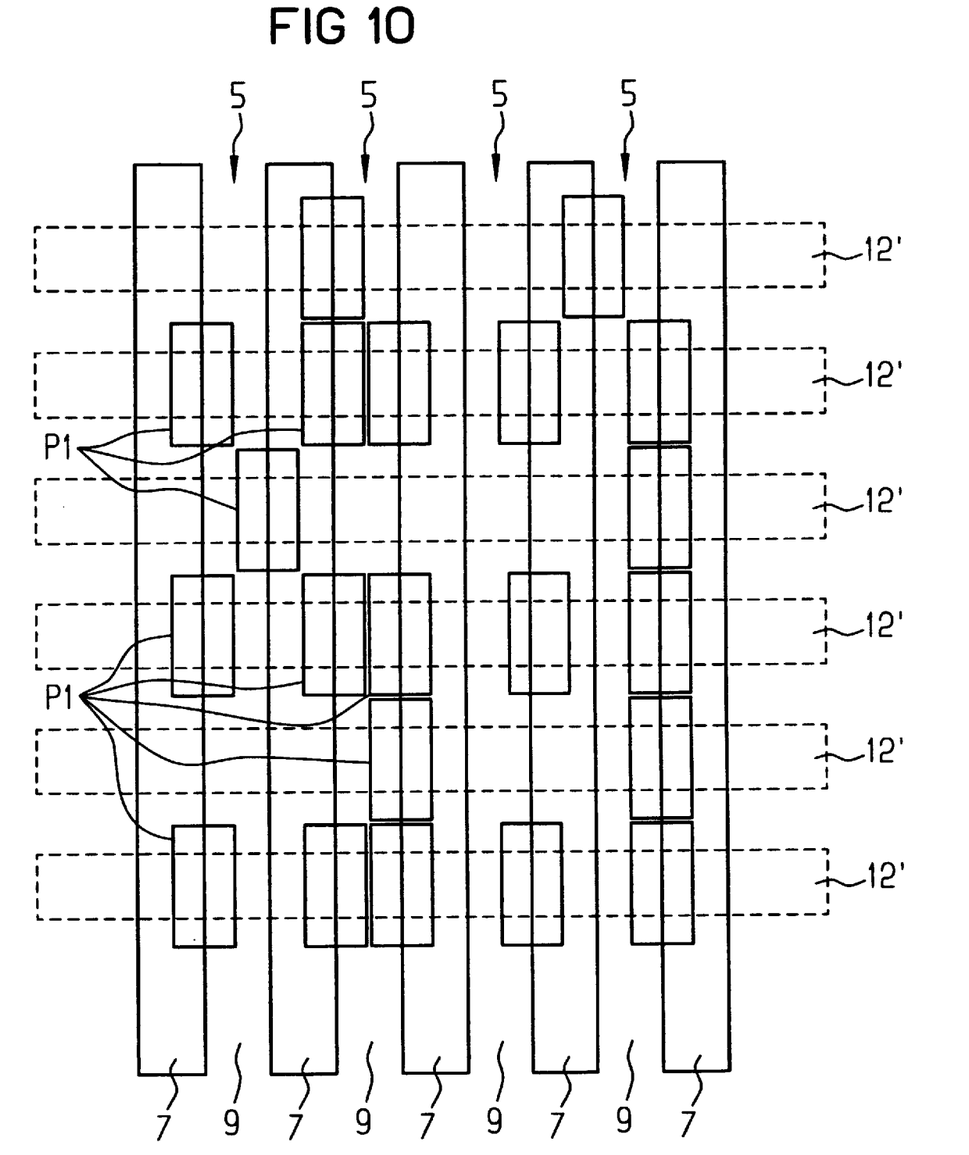
FIG. 10 shows a plan view of the structure shown in FIG. 7, 8 and 9.

Due to the structuring of the first electrode layer 12, first wordlines 12' arise in the region of the main surface 4, and first gate electrodes 12", connected therewith, arise in the region of the vertical MOS transistors (see FIG. 7, FIG. 8 and FIG. 9; in FIG. 8 and FIG. 9 the section shown in FIG. 7 is designated VII—VII, and in FIG. 7 the sections shown in FIG. 8 and FIG. 9 are designated VIII—VIII or, respectively, IX—IX). In addition, in the structuring of the first electrode layer 12 gaps 15 arise lateral to the first gate electrodes 12", since the width of the openings in the first programming mask 10 is 2F in the direction of the trenches 5, and the width of the first wordlines 12' is only one minimum structural size F, for example 0.4 µm (see FIG. 9). FIG. 10 shows a view of the structure in which the openings in the first programming mask 10 are entered as a contour line P1. Since the etching for the opening of the first holes 100 for the vertical MOS transistors takes place selectively to silicon, the first holes 100 are fashioned only in the region of the trenches 5 by removal of the respective part of the trench filling 9. The vertical MOS transistor arises at the adjoining edge of the trench 5. The strip-type doped regions 7, adjoining the respective edge of the trench 5, on the main surface 4 and on the floor of the trench 5 thereby act as source/drain regions of the vertical MOS transistor.

Figure 11:
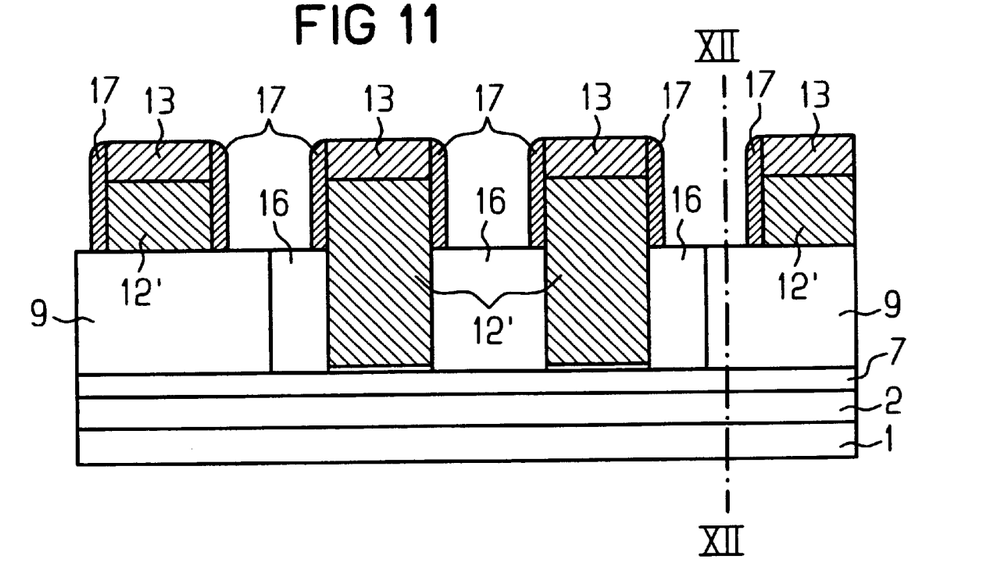
FIG. 11 shows the section, shown in FIG. 9, through the semiconductor substrate after the filling of gaps that have arisen lateral to the first gate electrodes with insulating material, and fashioning of insulating spacers at the edges of the first wordlines.
Figure 12:
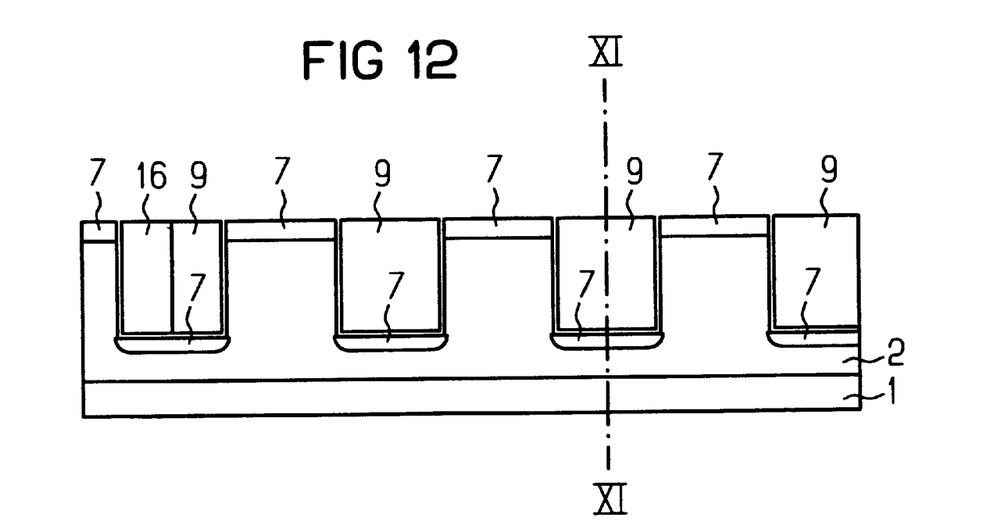
FIG. 12 shows the section shown in FIG. 11, designated XII—XII.

By means of conformal deposition, e.g. in a TEOS method, of an $SiO_2$ layer, and anisotropic etching back, the gaps 15 lateral to the first gate electrodes 12" are filled with filling structures 16 made of $SiO_2$ and are etched back (see FIG. 11). Subsequently, insulating spacers 17 are fashioned on the side walls of the first wordlines 12' by means of conformal deposition of an $Si_3N_4$ layer and anisotropic etching back, for example with $CHF_3$, $O_2$. The insulating spacers 17, made of silicon nitride, are fashioned in a width of 50 nm (see FIG. 11). Between adjoining first wordlines 12', the surface of the trench filling 9 or, respectively, of the filling structures 16 is thereby exposed (see the section designated XII—XII through FIG. 11, shown in FIG. 12. In FIG. 12, the section shown in FIG. 11 is designated XI—XI). Both the trench fillings 9 and the filling structures 16 were fashioned from TEOS-$SiO_2$, and thus have the same etching characteristics.

Figure 13:
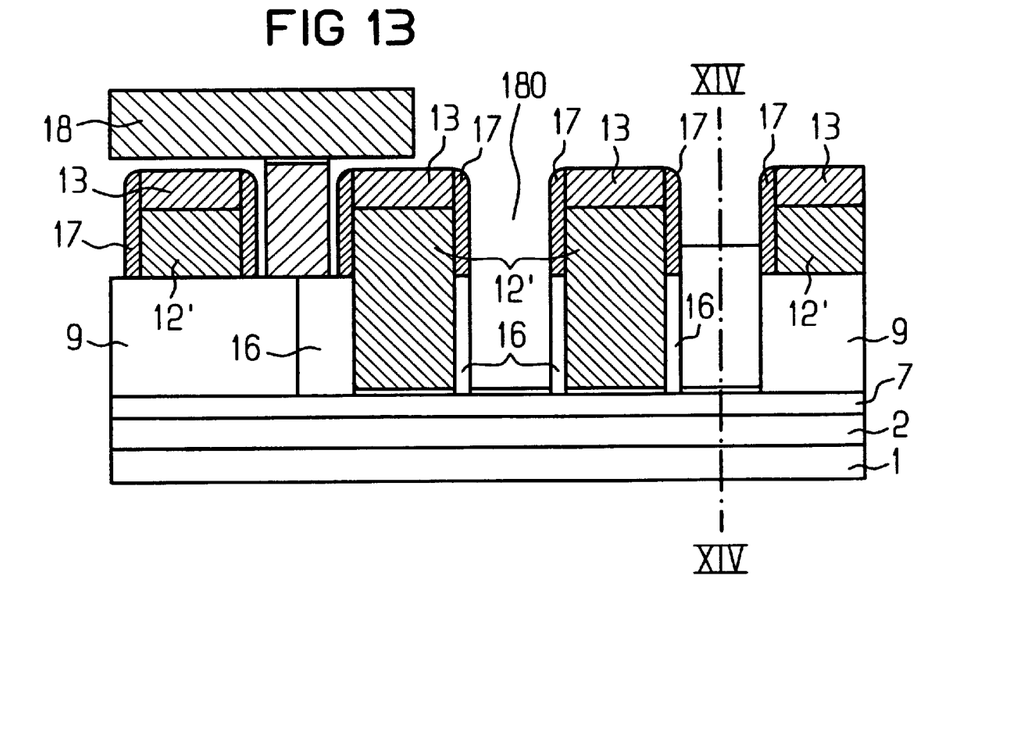
FIG. 13 shows the section shown in FIG. 11 after the fashioning of a second programming mask and the opening of second holes.
Figure 14:
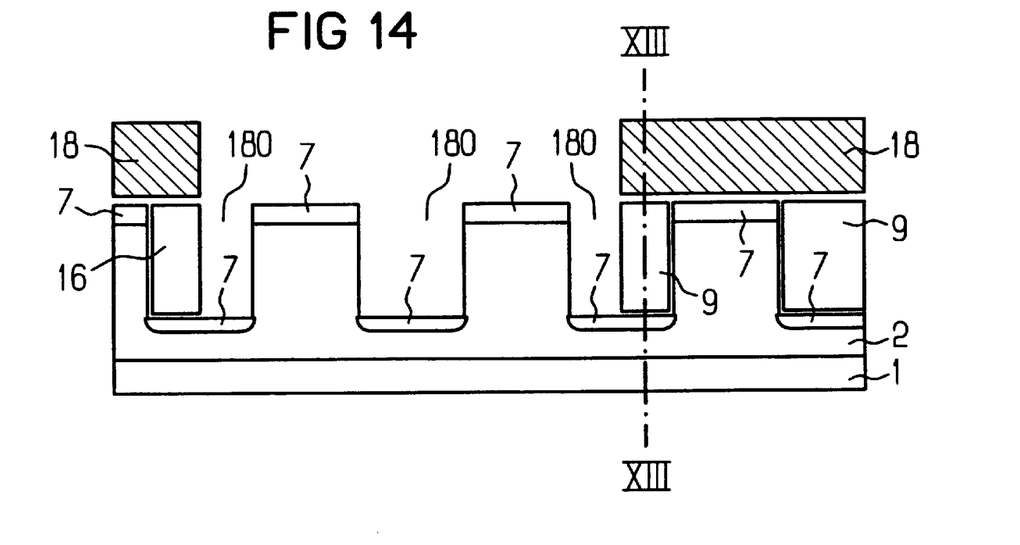
FIG. 14 shows the section designated XIV—XIV in FIG. 13.

A second programming mask 18 is fashioned from photoresist with the aid of photolithographic process steps. The second programming mask 18 has rectangular openings at locations at which vertical MOS transistors are to be fashioned, which openings have parallel to the trenches 5 a length of two minimum structural sizes F, e.g. 0.8 µm, and have transverse to the trenches 5 a width of one minimum structural size F, e.g. 0.4 µm. Adjoining openings in the second programming mask 18 coincide. The openings are respectively aligned in such a way that they overlap an edge of the trenches 5 (see FIG. 13 and FIG. 14). By means of anisotropic etching with $C_2F_6$, $C_3F_8$, selective to silicon nitride and to silicon, second holes 180 are etched. The insulating spacers 17 at the edges of the first wordlines 12' thereby act as masks. The width of the holes 180 is thus smaller than the spacing of adjoining first wordlines 12' (see FIG. 13). Underneath the insulating spacers 17, the first wordlines 12' or, respectively, first gate electrodes 12" remain covered by the filling structure 16. The etching takes place selectively both to silicon nitride and to silicon. On the trench floor, the surface of the strip-type doped region 7 arranged there is exposed.

Figure 15:
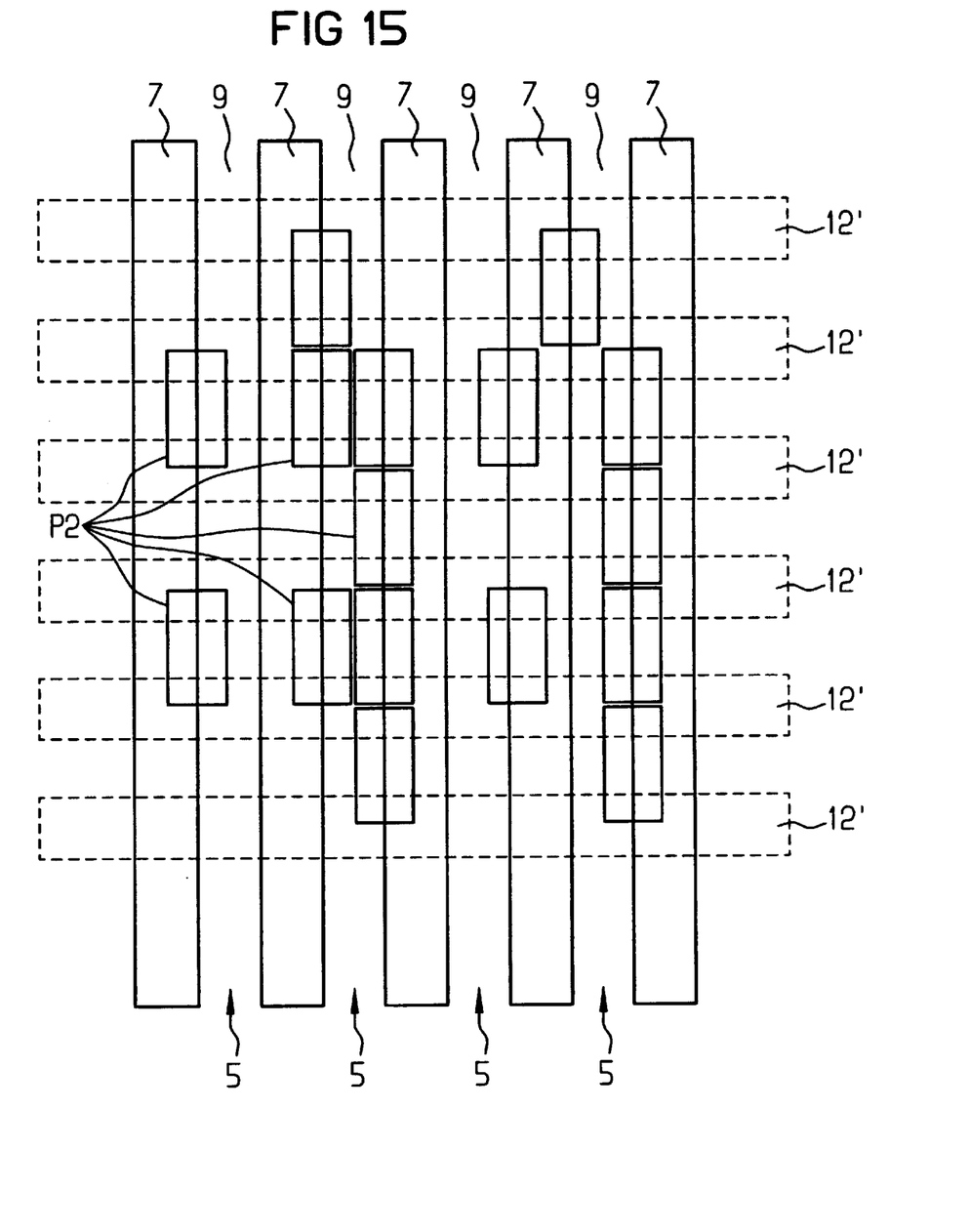
FIG. 15 shows a plan view of the structure shown in FIG. 13 and FIG. 14.

FIG. 15 shows a view of the structure. P2 thereby designates the contours of the openings in the second programming mask 18. The second programming mask 18 is aligned in such a way that the openings P2 overlap on the one hand one edge of a trench 5 and on the other hand two adjoining first wordlines 12'. By means of the selectivity of the etching used, the second holes 180 are then fashioned at the edge of the trench 5 between the two adjoining wordlines 12'.

Figure 16:
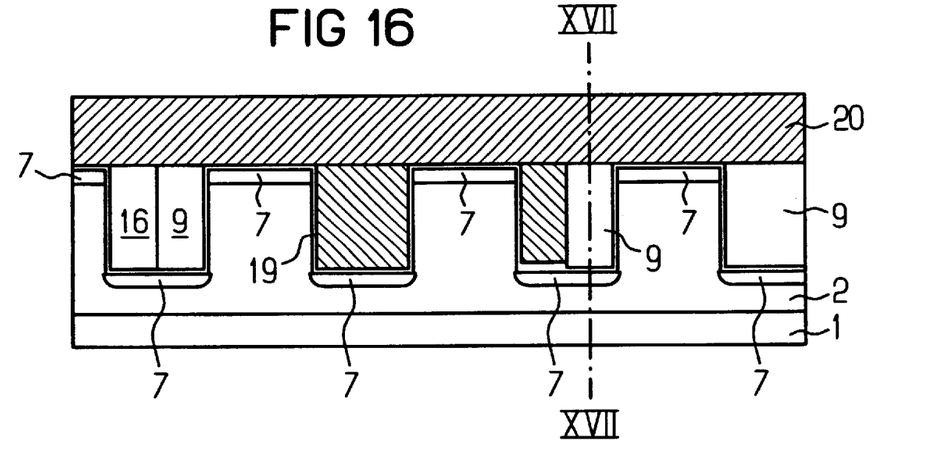
FIG. 16 shows the section shown in FIG. 14, designated XVI—XVI in FIG. 17, after the fashioning of a second gate dielectric and of a second electrode layer.

After removal of the photoresist of the second programming mask 18, a second gate dielectric 19 is fashioned at least at the exposed edges of the trenches 5, at which vertical MOS transistors are fashioned (see FIG. 16). The second gate dielectric 19 is fashioned for example by thermal oxidation at a temperature of 820° C., in a layer thickness of 10 nm. The second gate dielectric 19 arises during thermal oxidation at all exposed silicon surfaces, in particular at exposed surfaces of the strip-type doped regions 7.

Figure 17:
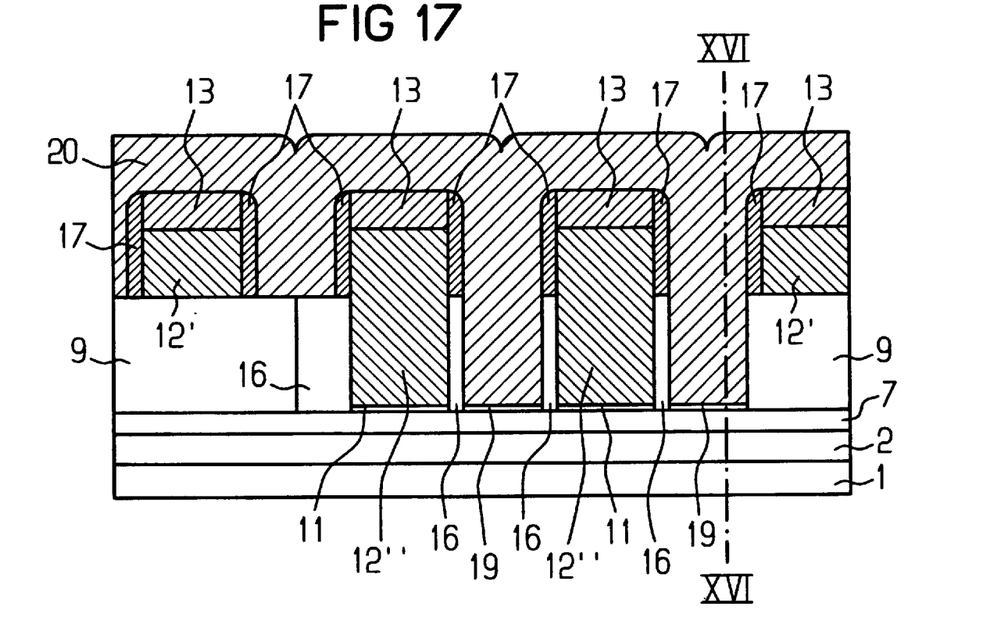
FIG. 17 shows the second section, designated XVII—XVII in FIG. 16, after deposition of a second electrode layer.

Subsequently, a second electrode layer 20, made for example of doped polysilicon, is deposited. The second electrode layer 20 is for example fashioned by in situ doped deposition in a thickness of for example 400 nm (see FIG. 16 and FIG. 17). Alternatively, the second electrode layer 20 can be fashioned from metal silicide or metal. The second electrode layer 20 completely fills the second holes 180 and the intermediate spaces between adjoining first wordlines 12'.

Figure 18:
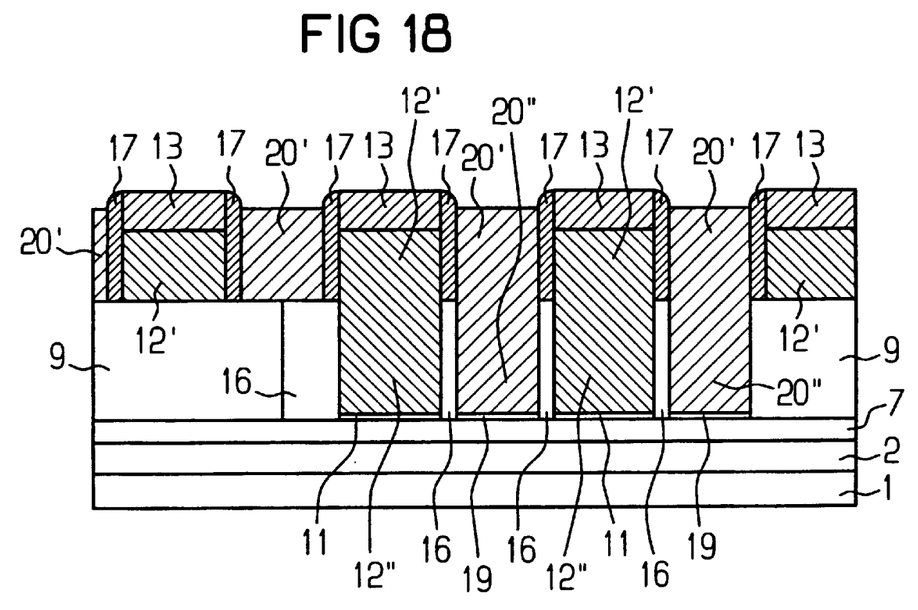
FIG. 18 shows the section shown in FIG. 17 after isotropic etching of the second electrode layer, for the fashioning of second wordlines and second gate electrodes.

By means of isotropic etching back of the second electrode layer 20, e.g. with $CF_4$, $O_2$, $N_2$, two self-aligned second wordlines 20' and, in the region of the second holes 180, second gate electrodes 20", are subsequently fashioned (see FIG. 18). The isotropic etching back takes place selectively to silicon nitride. The insulating spacers 17 and the structured insulating layer 13 thereby form an insulating structure made of silicon nitride that completely encapsulates the first wordlines 12'. The first gate electrodes 12" are insulated against the second gate electrodes 20" by the rest of the filling structures 16 remaining at the edges of the first gate electrodes 12".

Figure 19:
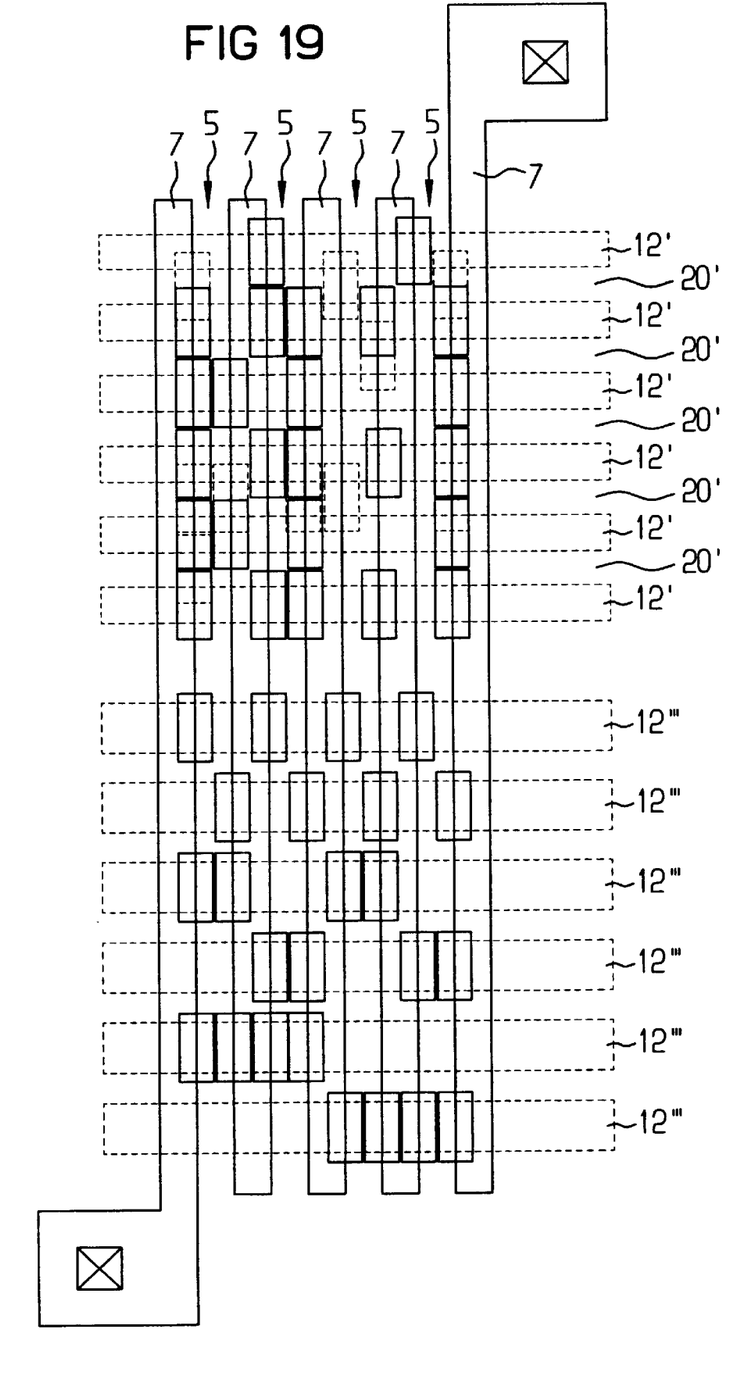
FIG. 19 shows a plan view of the finished memory cell arrangement with cell field and drive circuit.

FIG. 19 shows a top view of the memory cell arrangement. In the cell field 24, the first wordlines 12' and the second wordlines 20' are arranged in alternating fashion. They are insulated from one another by the insulating spacers 17 (not visible in FIG. 19). The spacing of the centers of the first wordlines 12' and of the adjoining second wordlines 20' has a minimum structural size F. The strip-type doped regions 7 run perpendicular thereto on the main surface 4 between adjacent trenches 5 and on the floor of the trenches 5. The spacing of the centers between the strip-type doped regions 7 likewise has a minimum structural size F. Since two memory cells are respectively fashioned at the opposite edges of the trenches 5 underneath the first wordlines 12' and the second wordlines 20', the surface requirement for four memory cells is $4F^2$. That is, the space requirement per memory cell is $1F^2$, e.g. 0.16 $\mu m^2$. The memory cell arrangement thus comprises memory cells that are arranged along first rows underneath the first wordlines 12' and memory cells arranged therebetween, arranged along second rows underneath the second wordlines 20'. Gaps run parallel to the trenches 5, respectively along the edges of the trenches 5.

Outside the cell field 24, in the structuring of the first electrode layer 12 selection lines 12'" are fashioned for a drive circuit 26. The drive circuit 26 comprises vertical MOS transistors whose arrangement in the first programming mask 10 is defined. In the opening of the first holes 100 in the cell field, holes are at the same time opened for the vertical MOS transistors of the drive circuit. The trenches 5 and the strip-type doped regions 7 extend beyond the region of the drive circuit. In this way, the drive circuit can be manufactured without additional process outlay in the fashioning of the vertical MOS transistors that are arranged underneath the first wordlines 12". The drive circuit can be fashioned both in the sense of a decoder and also in the sense of a selector switch.

The programming of the memory cell arrangement takes place during the manufacturing. The information to be stored is thereby contained in the arrangement of the openings in the first programming mask 10 and the second programming mask 18. In FIG. 19, vertical MOS transistors, whose arrangement is defined by the first programming mask 10, are entered as solidly drawn contours. Vertical MOS transistors, whose arrangement is defined by the second programming mask 18, are entered in FIG. 19 as dotted contours. Contacts are also shown in FIG. 19.

Although other modifications and changes may be suggested by those skilled in the art, it is the intention of the inventors to embody within the patent warranted hereon all changes and modifications as reasonably and properly come within the scope of their contribution to the art.

What is claimed is:

1. A method for manufacturing a memory cell arrangement, comprising the steps of:

forming a cell field with memory cells arranged in rows and columns on a main surface of a semiconductor substrate, said memory cells including first memory cells in which a first logical value is stored using an MOS transistor that is vertical to the main surface, and said memory cells including second memory cells in which a second logical value is stored, said second memory cells do not include an MOS transistor, including the following substeps:
doping the semiconductor substrate with a first conductivity type at least in the region of the cell field,
producing strip-type trenches that run essentially in parallel in a direction of the columns,
forming strip-type doped regions on a floor of the strip-type trenches and on the main surface between adjacent ones of said strip-type trenches,
doping regions with a second conductivity type which is opposite to the first conductivity type,
filling the strip-type trenches with a trench filling made of a first insulating material,
forming the memory cells at opposite edges of the strip-type trenches,
forming vertical MOS transistors, including the sub steps of
opening holes that respectively adjoin an edge of one of the strip-type trenches and that extend up to the strip-type doped region that runs on the floor of the strip-type trench, and
providing a gate dielectric and a gate electrode connected with a wordline on a surface of said strip-type doped region,
at first forming the memory cells arranged along first rows, said first rows alternating with second rows and forms therewith the rows of the cell field, including
forming first gate electrodes of the vertical MOS transistors arranged in the first rows and of the first wordlines that run parallel to the first rows, including the substeps of producing and structuring a first electrode layer,
forming insulation structures that cover a surface of the first wordlines and of the first electrodes,
subsequently forming memory cells along the second rows, including
forming second gate electrodes of the MOS transistors arranged in the second rows,
forming second wordlines between adjacent first wordlines, and
producing and structuring a second electrode layer.

2. A method according to claim 1, wherein said step of forming the insulating structures includes applying an insulating layer on the first electrode layer that is structured in common with the first electrode layer, and forming insulating spacers on the edges of the first wordlines.

3. A method according to claim 1, wherein said step of forming the vertical MOS transistors that are arranged along the first rows includes, forming the holes with a greater width than the first wordlines and first gate electrodes that are later to be structured so that after forming the first wordlines and of the first gate electrodes gaps arise in a region of the vertical MOS transistors lateral to the first gate electrodes, filling gaps with the first insulating material before forming the holes for the vertical MOS transistors that are arranged along the second rows, the insulating structures being of a second insulating material to which the trench fillings and the second electrode layer can be etched selectively, structuring the second electrode layer by etching back selectively to the insulating structures.

4. A method according to claim 1, further comprising the steps of:

forming masking spacers on side walls of the trenches before the step of forming the strip-type doped regions, removing said spacers before the filling of the trenches.

5. A method according to claim 1, wherein a spacing between adjacent trenches is essentially equal to a width of the trenches, and the hole for forming the vertical MOS transistors respectively extends up to half the width of the trench.

6. A method according to claim 1, wherein the trench fillings comprise silicon oxide, the insulating structures comprise silicon nitride, and the semiconductor substrate comprises monocrystalline silicon at least in the region of the cell field.

7. A method according to claim 1, further comprising the steps of:

dimensioning the trenches in a direction of the columns in such a way that they extend beyond the cell field, simultaneously with the step of forming the vertical MOS transistors that are arranged along the first rows, forming vertical MOS transistors for a drive circuit for the strip-type doped regions outside the cell field.

* * * * *